(12) United States Patent  
Baumgartner

(10) Patent No.: US 8,432,004 B2  
(45) Date of Patent: Apr. 30, 2013

(54) ASYMMETRIC SEGMENTED CHANNEL TRANSISTORS

(75) Inventor: Peter Baumgartner, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/271,778

(22) Filed: Oct. 12, 2011

(65) Prior Publication Data

US 2012/0025325 A1 Feb. 2, 2012

Related U.S. Application Data

(62) Division of application No. 12/036,911, filed on Feb. 25, 2008, now Pat. No. 8,067,287.

(51) Int. Cl.  
*H01L 29/76* (2006.01)

(52) U.S. Cl.  
USPC .......................................................... 257/401

(58) Field of Classification Search .................. 257/401  
See application file for complete search history.

(56) References Cited

U.S. PATENT DOCUMENTS

| | | | |
|---|---|---|---|
| 4,045,747 A * | 8/1977 | Hsu | 330/277 |
| 4,178,605 A | 12/1979 | Hsu et al. | |
| 4,247,824 A | 1/1981 | Hilbourne | |
| 4,529,948 A | 7/1985 | Bingham | |
| 4,550,284 A | 10/1985 | Sooch | |
| 5,047,814 A * | 9/1991 | Hazani | 257/317 |
| 5,471,422 A * | 11/1995 | Chang et al. | 365/185.26 |
| 5,514,992 A | 5/1996 | Tanaka et al. | |
| 5,604,367 A * | 2/1997 | Yang | 257/321 |
| 5,811,338 A | 9/1998 | Kao et al. | |
| 5,894,245 A | 4/1999 | Cho | |
| 5,966,005 A | 10/1999 | Fujimori | |
| 6,087,894 A | 7/2000 | Barrett, Jr. et al. | |
| 6,121,093 A | 9/2000 | Cheng et al. | |
| 6,133,764 A | 10/2000 | Griffith et al. | |
| 6,211,659 B1 | 4/2001 | Singh | |

(Continued)

FOREIGN PATENT DOCUMENTS

| | | |
|---|---|---|
| DE | 10 2006 020 210 A1 | 3/2007 |
| WO | WO 2006/123446 A1 | 11/2006 |

OTHER PUBLICATIONS

Smith, D., et al., "Evolution of High-Speed Operational Amplifier Architectures," IEEE Journal of Solid-State Circuits, vol. 29, No. 10, Oct. 1994, pp. 1166-1179.

(Continued)

*Primary Examiner* — Thao P. Le  
(74) *Attorney, Agent, or Firm* — Slater & Matsil, L.L.P.

(57) ABSTRACT

Structures, layouts and methods of forming integrated circuits are described. In various embodiments, the current invention includes an asymmetric segmented transistor. The asymmetric segmented transistor includes a source region and a drain region disposed within an active region, a floating source/drain region disposed within the active region, a first channel region disposed in the active region between the source region and the floating source/drain region, the first channel having a first length and a first width. A second channel region is disposed in the active region between the drain region and the floating source/drain region, the second channel having a second length and a second width. A first gate dielectric overlies the first channel region and a second gate dielectric overlies the second channel region. A gate line overlies the first gate dielectric and the second gate dielectric.

37 Claims, 13 Drawing Sheets

U.S. PATENT DOCUMENTS

| | | |
|---|---|---|
| 6,466,489 B1 | 10/2002 | Ieong et al. |
| 6,468,849 B1 | 10/2002 | Efland et al. |
| 6,482,724 B1 | 11/2002 | Chatterjee |
| 6,573,568 B2 * | 6/2003 | Lin et al. ............... 257/365 |
| 6,680,226 B2 | 1/2004 | Efland et al. |
| 6,716,706 B1 | 4/2004 | Krivokapic |
| 6,882,011 B1 * | 4/2005 | Chen ...................... 257/355 |
| 6,906,376 B1 * | 6/2005 | Hsu et al. ............... 257/315 |
| 6,916,716 B1 | 7/2005 | Goad et al. |
| 7,098,499 B2 * | 8/2006 | Wang ...................... 257/302 |
| 7,700,993 B2 * | 4/2010 | Cai et al. ............... 257/315 |
| 7,701,005 B1 * | 4/2010 | Bulucea et al. ......... 257/336 |
| 7,868,372 B2 * | 1/2011 | Chen et al. .............. 257/315 |
| 2003/0119230 A1 | 6/2003 | Chida et al. |
| 2006/0017092 A1 * | 1/2006 | Dong et al. .............. 257/314 |
| 2007/0117323 A1 | 5/2007 | Yeh |
| 2008/0121997 A1 * | 5/2008 | Yang et al. .............. 257/365 |
| 2008/0169497 A1 | 7/2008 | Iino et al. |
| 2008/0224221 A1 * | 9/2008 | Yang et al. .............. 257/365 |
| 2009/0085069 A1 | 4/2009 | Mei et al. |
| 2009/0114971 A1 * | 5/2009 | Cai et al. ............... 257/315 |
| 2009/0140346 A1 | 6/2009 | Edwards et al. |
| 2009/0166743 A1 | 7/2009 | Pillarisetty et al. |
| 2009/0309775 A1 | 12/2009 | Ikoma |

OTHER PUBLICATIONS

Tsividis, Y. P., et al., "An Integrated NMOS Operational Amplifier with Internal Compensation," IEEE Journal of Solid-State Circuits, vol. SC-11, No. 6, Dec. 1976, pp. 748-753.

* cited by examiner

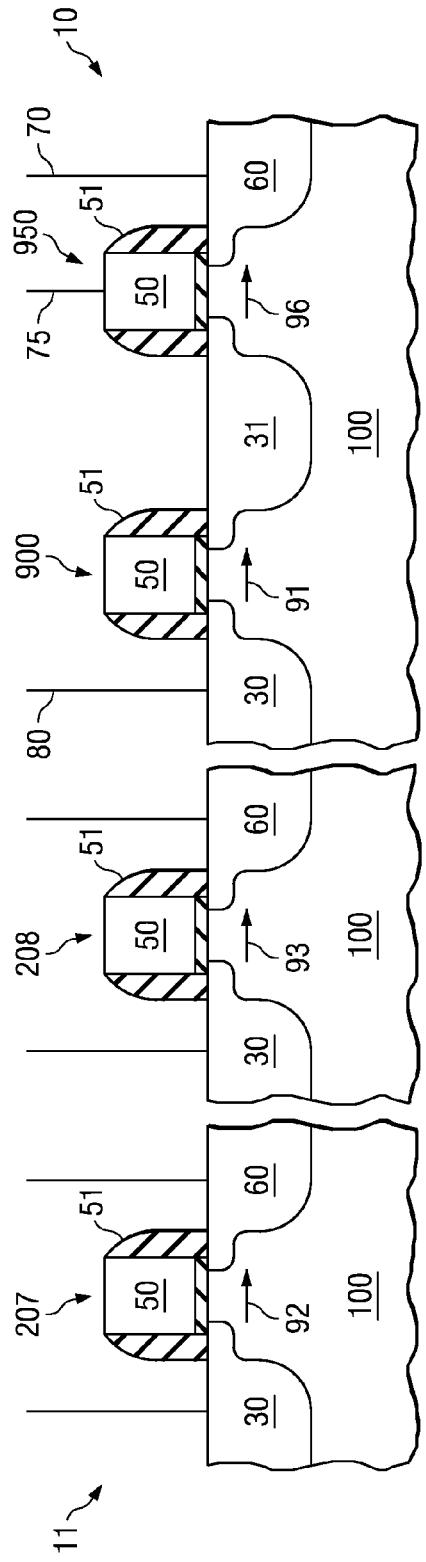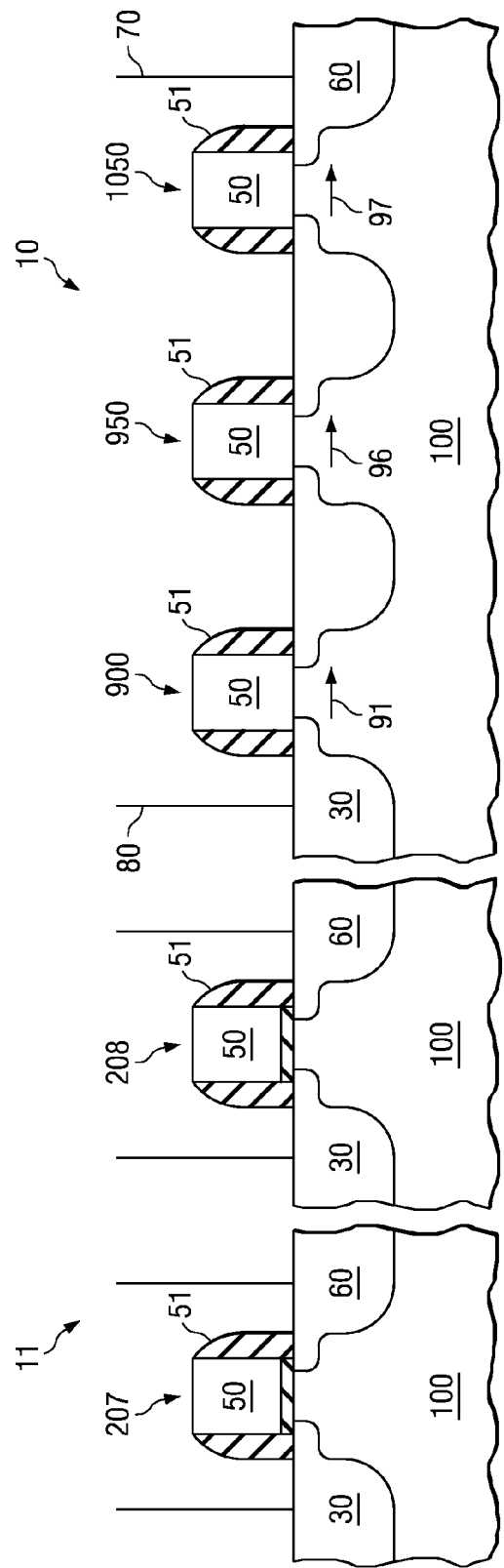

ASYMMETRIC SEGMENTED CHANNEL TRANSISTORS

This application is a divisional of U.S. patent application Ser. No. 12/036,911 filed on Feb. 25, 2008, which application is incorporated herein in entirety by reference.

TECHNICAL FIELD

This invention relates generally to electronic devices, and in particular embodiments to asymmetric segmented channel transistors.

BACKGROUND

Semiconductor devices are used in a large number of electronic devices, such as computers, cell phones and others. One of the goals of the semiconductor industry is to continue shrinking the size and increasing the speed of individual devices. Every generation of semiconductor devices is smaller than the previous generation by about 50%, thus reducing the cost per device significantly.

A key challenge in scaling semiconductor devices arises due to the increase in leakage currents at short channel lengths. Halo implants are used to mitigate this increase leakage arising from short channel effects. However, use of halo implants increases the channel doping as well counter-dopes the source and drain junctions. Both these effects increase the effective resistance of the transistor. However, short channel devices compensate some of this loss by gate length scaling accompanying the technology development. However, longer gate length transistors built on such short channel device technologies do not enjoy this advantage and are hence degraded. This is often not a problem in digital technologies that use only the short gate length devices.

Analog circuits typically employ longer gate length devices and cannot take advantage of these aggressively scaled transistors. For example, these short channel digital devices have lower analog intrinsic gain as well as increased gate leakages. Due to cost constraints, analog technologies utilize the CMOS technologies developed for digital applications. As the long gate lengths devices are also degraded, many analog applications require individually tailored technology flows, considerably increasing production costs.

Hence, improved methods, structures of forming and designing analog devices are needed that are compatible with existing CMOS technologies.

SUMMARY OF THE INVENTION

These and other problems are generally solved or circumvented, and technical advantages are generally achieved, by embodiments of the present invention which provide structure, methods and circuits comprising asymmetric devices.

Embodiments of the invention include methods, structures and layouts for asymmetric segmented transistors in integrated circuits. In accordance with an embodiment of the present invention, a mixed signal integrated circuit includes an asymmetric segmented transistor comprising a source region and a drain region disposed within an active region, a floating source/drain region disposed within the active region, a first channel region disposed in the active region between the source region and the floating source/drain region, the first channel having a first length and a first width. A second channel region is disposed in the active region between the drain region and the floating source/drain region, the second channel having a second length and a second width. A first gate dielectric overlies the first channel region and a second gate dielectric overlies the second channel region. A gate line overlies the first gate dielectric and the second gate dielectric.

The foregoing has outlined rather broadly the features of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 3, which includes FIGS. 3a-3c, illustrates a structural embodiment of the invention, wherein FIGS. 3a and 3b illustrate top cross sections and FIG. 3c illustrates a cross sectional view;

FIG. 6, which includes

FIG. 8, which includes

FIG. 9, which includes FIGS. 9a and 9b, wherein FIG. 9a illustrates an embodiment of a mixed signal chip comprising analog devices and logic devices and FIG. 9b illustrates the threshold voltages used in the analog and logic devices in accordance with embodiments of the invention;

FIG. 10, which includes FIGS. 10a and 10b, wherein FIG. 10a illustrates an embodiment of a mixed signal chip comprising analog devices and logic devices, the analog devices comprising at least one device with multiple segments.

FIG. 11, which includes FIG. 12, which includes

Corresponding numerals and symbols in the different figures generally refer to corresponding parts unless otherwise

DETAILED DESCRIPTION OF ILLUSTRATIVE EMBODIMENTS

Figure 1:
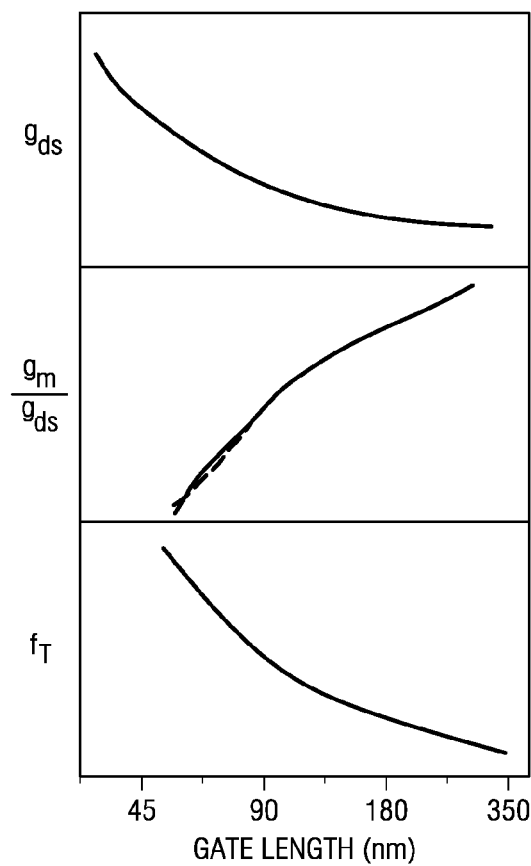
FIG. 1 illustrates the key analog device parameters for different gate length transistors.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely as an asymmetric segmented channel transistor. Embodiments of the present invention include methods, structure, layouts, and circuits comprising asymmetric segmented channel transistor. The invention may also be applied, however, to other semiconductor components comprising, for example, other non CMOS devices. One of ordinary skill in the art will be able to recognize further examples as well.

Digital applications primarily drive CMOS scaling, in which the objectives are different—smaller, faster, and lower-power devices. Extremely scaled CMOS devices of about 30 nm are already in production, and further smaller devices are being explored. These small devices exhibit excellent speed (drive currents) but some of this performance is at the expense of much higher device off-current, about 100 nA/μm at 25° C., significantly compromising the low-standby-power attribute of CMOS technologies. To maintain enough gate current control, these extremely scaled devices typically use ultra-thin gate oxides (1.5 nm or thinner), resulting in gate tunneling current density as large as 10-100 A/cm². However, devices used in analog circuits cannot handle such large gate currents. Typically, this is not a problem as CMOS technologies offer multiple gate oxide technologies.

However, the speed (drive current) of the device is not the only Figure of Merit (FOM) the analog designer has to deal with. Other specifications that are as important if not more are device transconductance ($g_m$), output conductance ($g_{ds}$), cutoff frequency ($f_T$), maximum frequency of oscillation ($f_{max}$), Vt matching, 1/f noise and NF characteristics. Dynamic range is also important, along with other economic issues such as time to market, system specs and cost.

The small signal transconductance $g_m$ is defined as change in drain current $I_{ds}$ of a CMOS transistor for a given change in gate voltage $V_g$ and hence $g_m = dI_{ds}/dV_g$. The transconductance degrades with increase in gate voltage $V_g$ due to degradation in mobility arising from increased surface roughness scattering. Again at high channel dopings, the transconductance degrades due to impurity induced coulomb (or impurity) scattering. In scaled CMOS devices, the channel doping is high due to the need for shielding source of the device from the drain of the device, or rather reduce the off current. Typically, halo implants are used to control short channel effects. However, this halo doping also counter-dopes the source and drain regions. Consequently the source and drain extension regions of the transistor are also significantly degraded (reducing $g_m$) due to increased resistance from the counter doping of the halo implants. A long channel transistor built with such halo implants may not be as significantly impacted by the reduced $g_m$ around the source/drain regions as the middle section of the long channel transistor has no halo doping.

The parameter output conductance $g_{ds}$ relates the sensitivity of drain current to a change in drain voltage, and hence $g_{ds} = dI_{ds}/dV_{ds}$. A small output conductance is desirable for many analog circuit applications. However, high-speed CMOS devices usually have a large output conductance. The large output conductance is a direct result of the fact that short-channel devices have a large drain-induced barrier-lowering effect which causes the drain current to increase with drain voltage. Hence, as illustrated in FIG. 1, $g_{ds}$ increases with gate length. When small output conductance is needed, designers often use device channel lengths significantly larger than minimum for the technology. However, the additional halo dose added to control the drain induced barrier lowering also significantly degrades the output conductance $g_{ds}$. Hence, longer channel devices built on technologies optimized for short channel devices suffer from increased output conductance $g_{ds}$.

The primary analog device design strives to: (a) maximize speed of the amplifier ($\sim g_m/C_{load}$); (b) achieve $g_m$ at lowest possible current to minimize power consumption (hence maximize $g_m/I_{ds}$); (c) maintain accuracy (e.g. of the single stage amplifier) by maximizing the voltage gain $g_m/g_{ds}$; (d) minimize device mismatch (e.g. $V_T$) between identical devices; and (e) minimize noise (low frequency 1/f or flicker noise and high frequency noise such as NF noise).

A commonly used figure of merit for quantifying speed or $g_m/G_{ad}$ is the cutoff frequency ($f_T$), which is defined as the frequency at which the small signal current gain drops to unity. The cutoff frequency is a measure of the maximum useful frequency of a transistor when it is used as an amplifier. Scaled CMOS devices can have very high cutoff frequency. However, the series resistances associated with the source/drain and gate, together with the characteristic short-channel effects associated with very-short-channel CMOS devices, limits the attainable maximum frequency of oscillation ($f_{max}$). The maximum frequency of oscillation ($f_{max}$) is the frequency at which unilateral current gain becomes unity, and is hence a more reliable metric. The typical scale of operation of an application is about 5-10 times lower than the $f_T$.

Currently there is great interest in developing CMOS with reduced parasitic resistance, including using a metal as the gate electrode. With a metal gate and careful layout to minimize parasitic resistance, the attainable $f_{max}$ could approach 300 GHz. However, another key metric, intrinsic voltage gain $g_m/g_{ds}$ is significantly degraded for scaled CMOS devices (FIG. 1).

Figure 2:
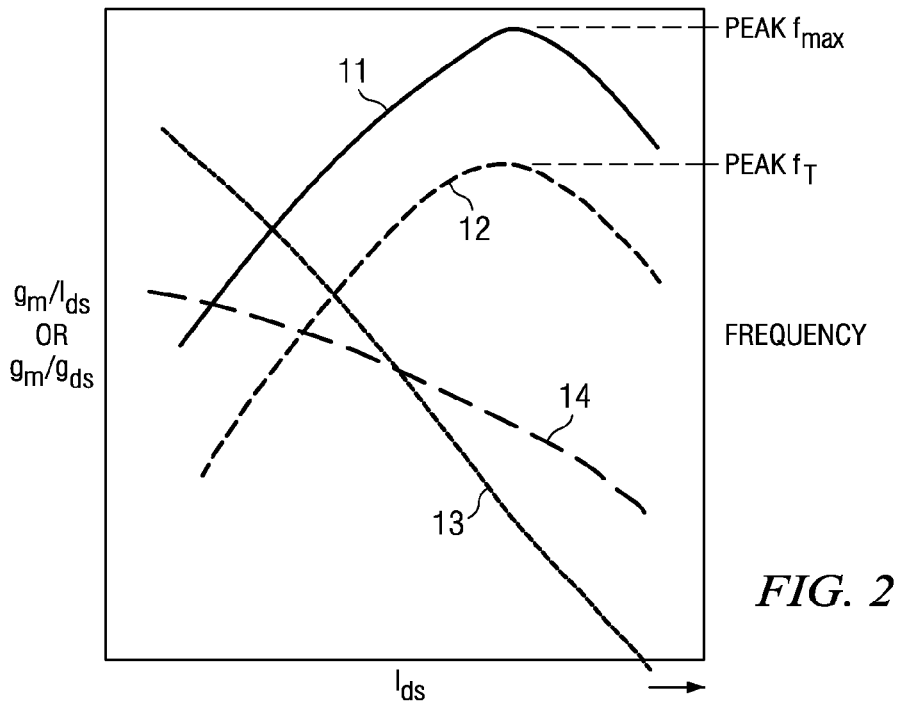
FIG. 2 illustrates the key analog device parameters for a given device or gate length.

FIG. 2 illustrates the tradeoff in key parameters in designing analog devices. For a given gate length device, a peak in $f_T$ (curve 11) and $f_{max}$ (curve 12). For example, $f_T$ increases with source to drain current $I_{ds}$ (or gate over drive). However, both $g_m/g_{ds}$ (curve 14) and $g_m/I_{ds}$ (curve 13) degrade with increasing source to drain current $I_{ds}$. At any given technology node, simultaneous maximization of $f_T$ and intrinsic voltage gain $g_m/g_{ds}$ is not possible. Hence, analog devices are typically designed based on application i.e. high performance analog technologies favoring higher speed, and precision analog technology favoring intrinsic voltage gain. Hence, independently optimized devices are used to overcome these limitations. For example, devices with high intrinsic gain can be fabricated using long channel length with low channel doping. These devices may be suitably designed to maintain a high intrinsic voltage gain. However, as discussed this comes with a penalty in $f_T$.

Hence, applications requiring high $f_T$ may be custom designed on a different technology such as a BiCMOS process flow. However, rather than implement expensive solutions such as adopting an independent BiCMOS process flow, many applications require a low cost solution and instead compromise some of the device metrics. For example, a BiC- MOS process may be 30-40% more expensive than a corresponding CMOS process. Hence, for many applications devices are tailored for each application and do not utilize the product development and enhancements available in CMOS process flows. For example, such analog devices are designed with thicker oxides, longer channel lengths, and unique source/drain extensions. Consequentially, this process requires a custom CMOS flow and is still expensive for many applications.

In various embodiments, the present invention overcomes these limitations by reducing the process complexity associated with formation of analog high performance and/or high precision CMOS devices. In various embodiments, the analog device comprises a combination of a short gate length CMOS device and a long gate CMOS device into a single structure to tailor an analog device with suitable device characteristics. In various embodiments, properties of a longer gate length device are achieved by a suitable combination of smaller gate length devices.

Structural embodiments of the invention will be first described using FIGS. 3 and 6. Various embodiments of the method of fabrication will then be described using the flow chart of FIG. 7, and FIG. 8. Embodiments of manufacturing and chips manufactured with logic and analog devices are illustrated in FIGS. 9 and 10. Finally, embodiments of the invention applied in analog circuits will illustrated in FIGS. 11 and 12.

Figure 3A:
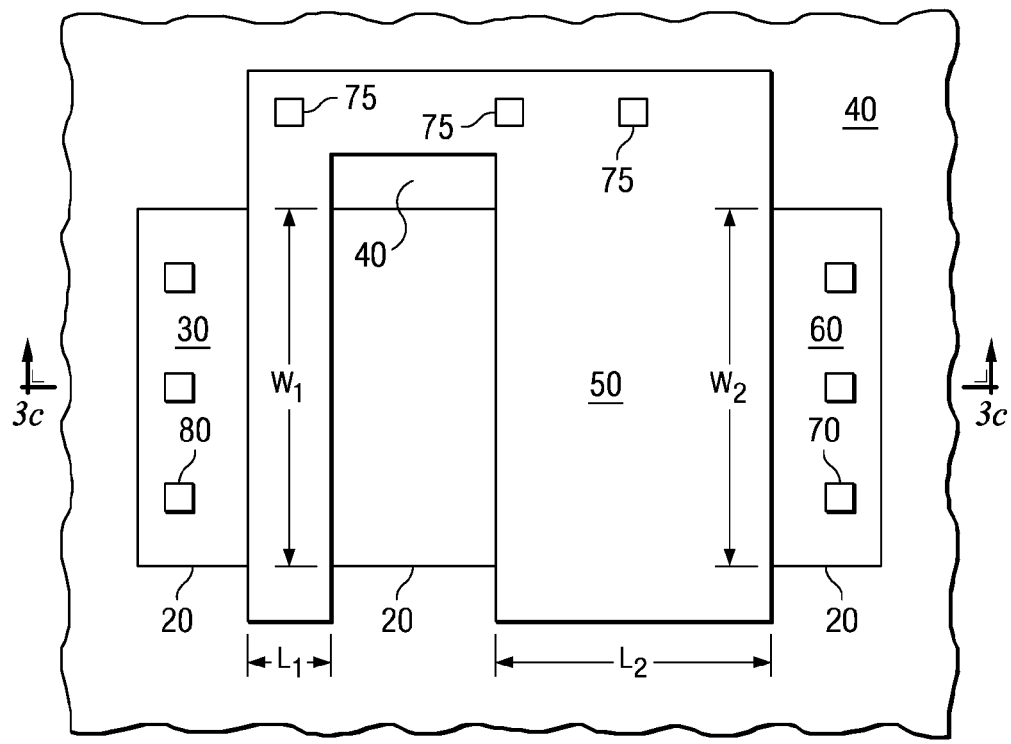
Figure 3B:
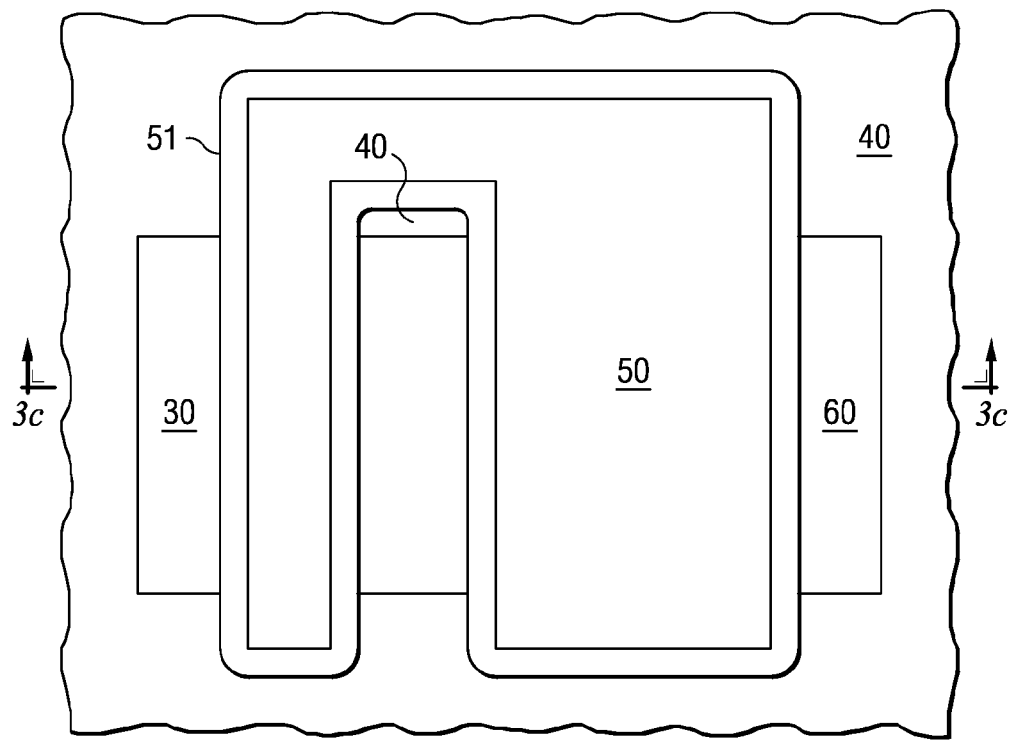
Figure 3C:
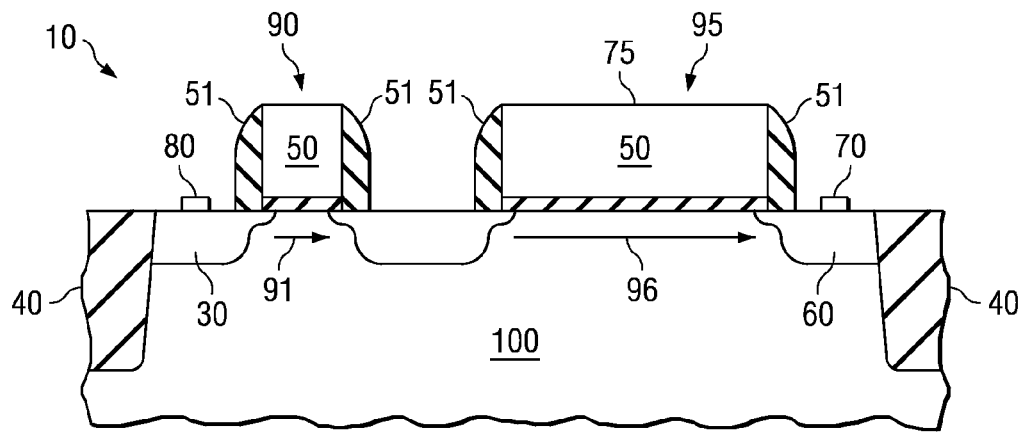

An embodiment of the invention is illustrated in FIG. 3 which includes FIG. 3a-3c. FIGS. 3a and 3b illustrate the top cross sectional view and FIG. 3c illustrates a vertical cross sectional view of the asymmetric channel transistor.

FIG. 3a illustrates a top cross section of the device illustrating a layout (e.g. regions in mask layers for forming regions) in an embodiment of the invention. The device is embedded in an isolation region 40, which, for example, may be an STI region.

The silicon active region 20 is surrounded by the isolation region 40 and contains a source 30 and a drain 60. The gate line 50 includes a "U" shaped region forming two distinct gate regions overlying the silicon active region 20. The contacts 70, 75 and 80 are disposed on the drain 60, gate line 50 and source 30 respectively. FIG. 3b illustrates the top cross section after formation of active regions. As illustrated in FIG. 3b, the spacer 51 is disposed around the gate line 50. The gate line 50 and the spacer 51 overlie the isolation region 40 forming the "U" shaped region. FIG. 3c illustrates the corresponding vertical cross section of the device 10 disposed in a substrate 100. The isolation region 40 of the device 10 comprises shallow trench isolation and typically comprises a trench filled with an oxide material. The source is contacted via source contact 80 by connecting to a voltage node and applies a first voltage. The second terminal or drain contact 70 is connected to voltage node to apply a second voltage. The gate line 50 is connected to a third voltage using gate contacts 75. The gate line 50 includes a first gate 90 and a second gate 95. The first and second gate 90 and 95 form corresponding first channel 91 and second channel 96 underneath. The potential difference applied between the source contact 80 and drain contact 70 determines the direction of the current flow (shown by the arrow). For the sake of illustration, a forward biased device has a current flow as shown by the arrow in FIG. 3c. A reverse biased device has the potential difference reversed and hence reversing the direction of the corresponding flow of current. In all these cases the gate contacts 75 (and substrate 100) are biased to form an inversion layer in the first and second channels 91 and 96.

As illustrated in FIG. 3a, the first gate 90 has a gate length $L_1$ and width $W_1$, and the second gate 95 has a gate length $L_2$ and width $W_2$. In various embodiments, the first gate 90 and second gate 95 comprise different gate lengths. In preferred embodiments, the second gate length $L_2$ is about 1.5 to 2.5 times the length of the first gate length $L_1$, and the first gate length $L_1$ is at the minimum gate length for the given technology. Typically but necessarily, the widths $W_1$ and $W_2$ are about equal.

In various embodiments, a method of optimization for determining the lengths and widths uses an optimization procedure to match the target specifications derived for an individual circuit. The device is tailored for each circuit by individually changing the lengths and widths of the devices.

Figure 4A:
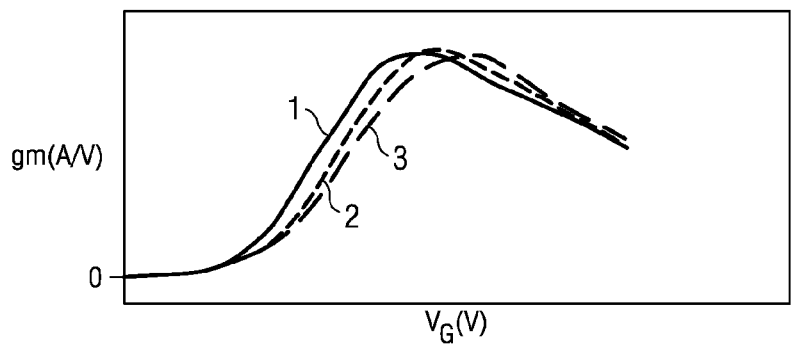
FIG. 4, which includes FIG. 4a-4c, compares the key analog device parameters from the structural embodiment described in FIG. 3 for use in high precision analog circuits.
Figure 4B:
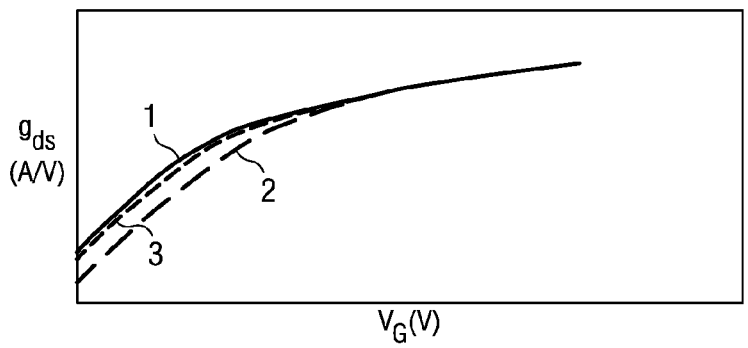
Figure 4C:
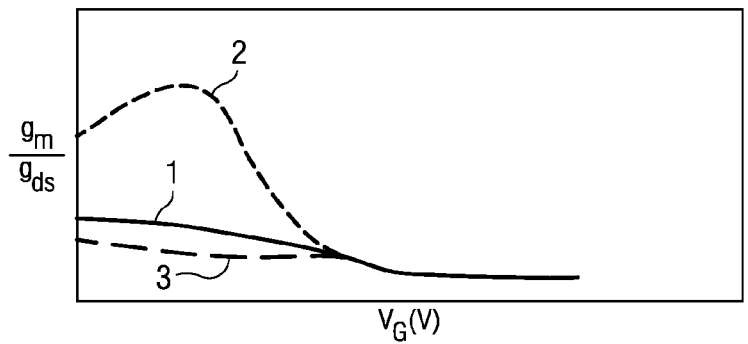
Figure 5:
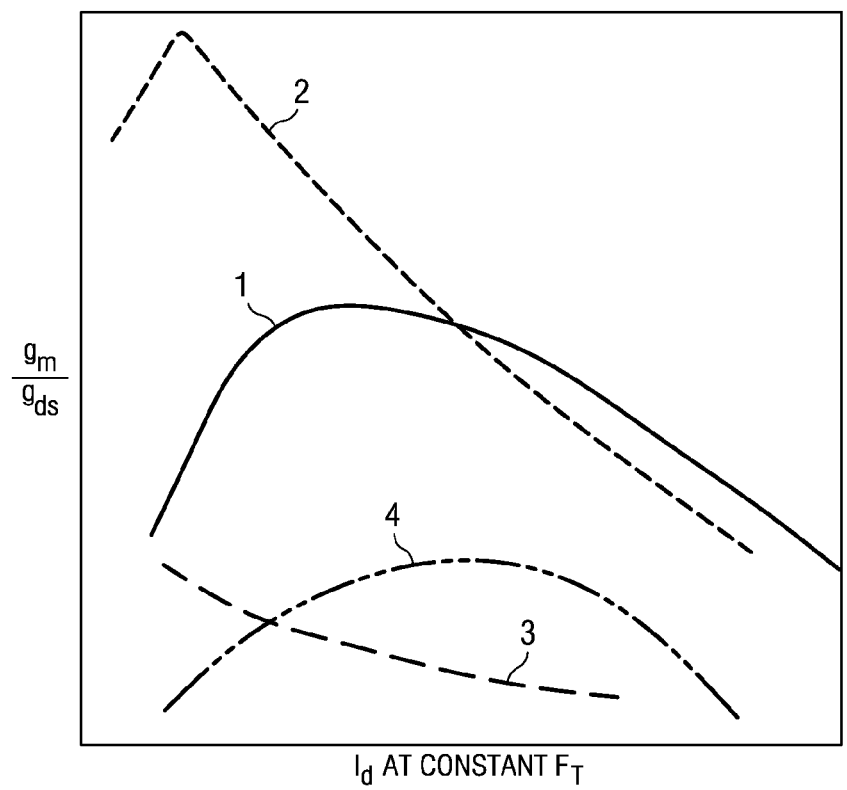
FIG. 5 compares the key analog device parameters from the structural embodiment described in FIG. 3 for use in high performance analog circuits.

The performance of the device 10 (e.g. of FIG. 3c) after the optimization, in different embodiments is illustrated in FIGS. 4 and 5. FIGS. 4a-4c illustrate a precision analog device with optimized intrinsic voltage gain. Curve 2 refers to the device in FIG. 1 biased in forward bias mode. Curve 3 refers to the device in FIG. 1 biased in reverse bias mode. Curve 1 refers to a standard symmetric device. The standard symmetric device is a longer channel device such that the gate length of the standard device is longer than the sum of the first gate length $L_1$ of the first gate and the second gate length $L_2$ of the second gate. Using embodiments of the invention, curve 2 illustrates improvements in $g_m$ and $g_{ds}$ (hence, the ratio $g_m/g_{ds}$) obtainable over the standard device especially in bias conditions suitable for analog operation (gate voltage is about 100 mV above the threshold voltage). Even the reverse biased device shows respectable device characteristics.

FIG. 5 illustrates the embodiments of the invention applied for producing a analog device for high performance applications. In such applications, a high $f_T$ is required while maximizing the intrinsic gain. Hence, FIG. 6 illustrates $g_m/g_{ds}$ at constant $f_T$. In FIG. 6, curve 1 represents a long channel device and curve 4 illustrates a short channel device showing degraded $g_m/g_{ds}$. Curve 2 illustrates the forward biased asymmetric device illustrating an improved intrinsic voltage gain, using embodiments of the invention e.g. as shown in FIG. 3. Curve 3 illustrates the reverse biased asymmetric device.

Figure 6A:
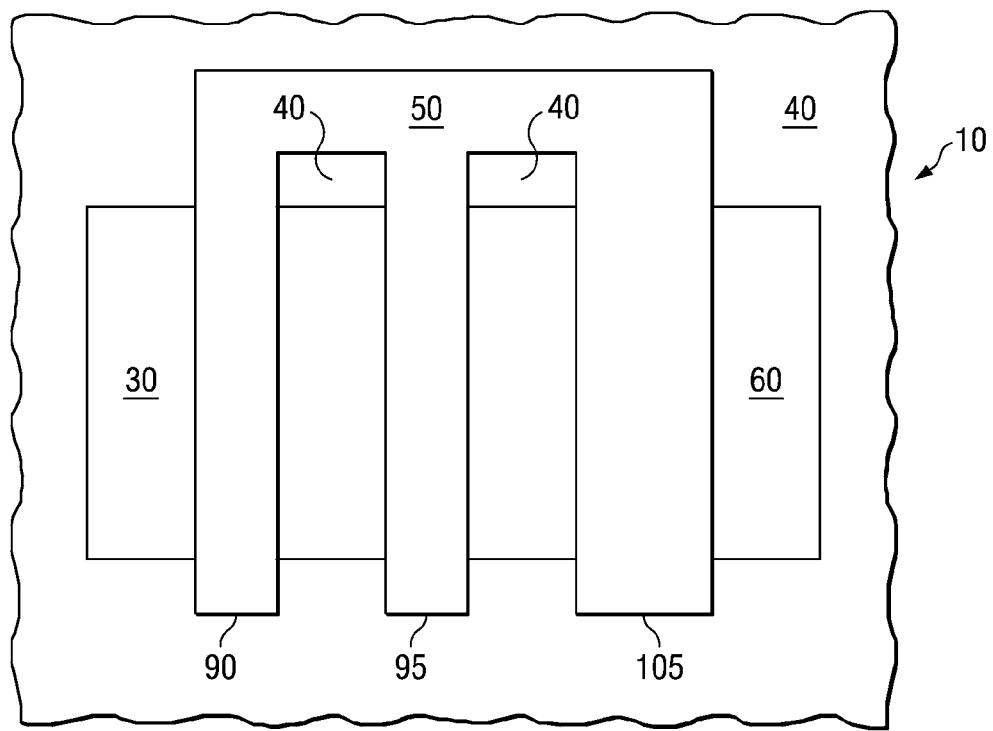
FIGS. 6a-6f, illustrates a top view of structural embodiments of the invention.
Figure 6B:
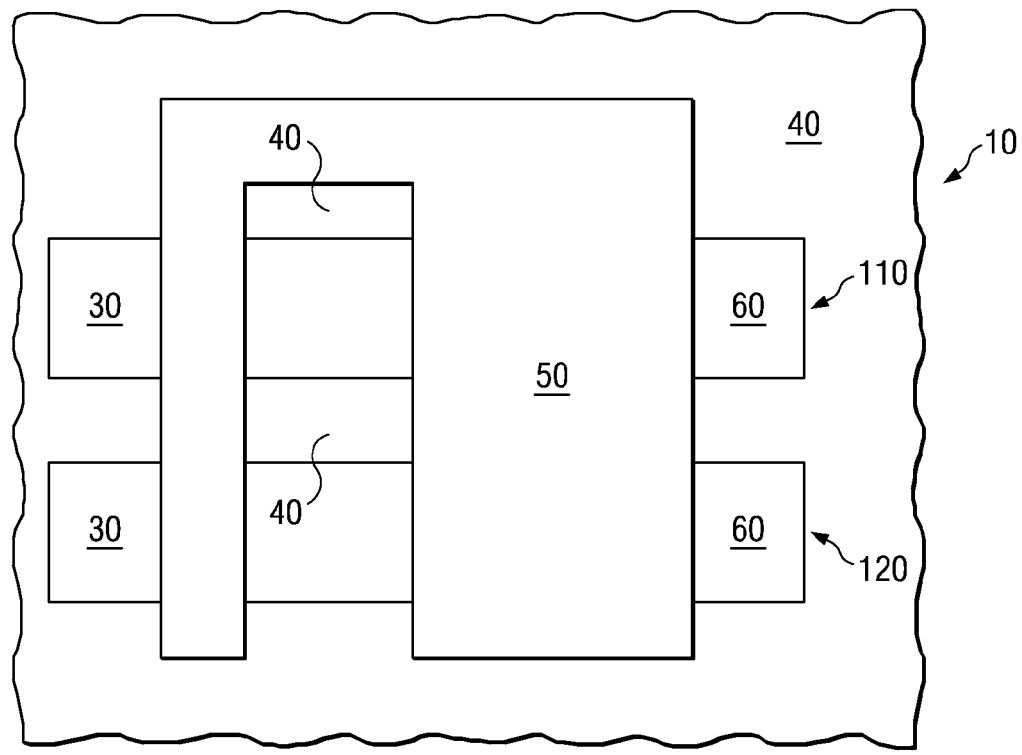
Figure 6C:
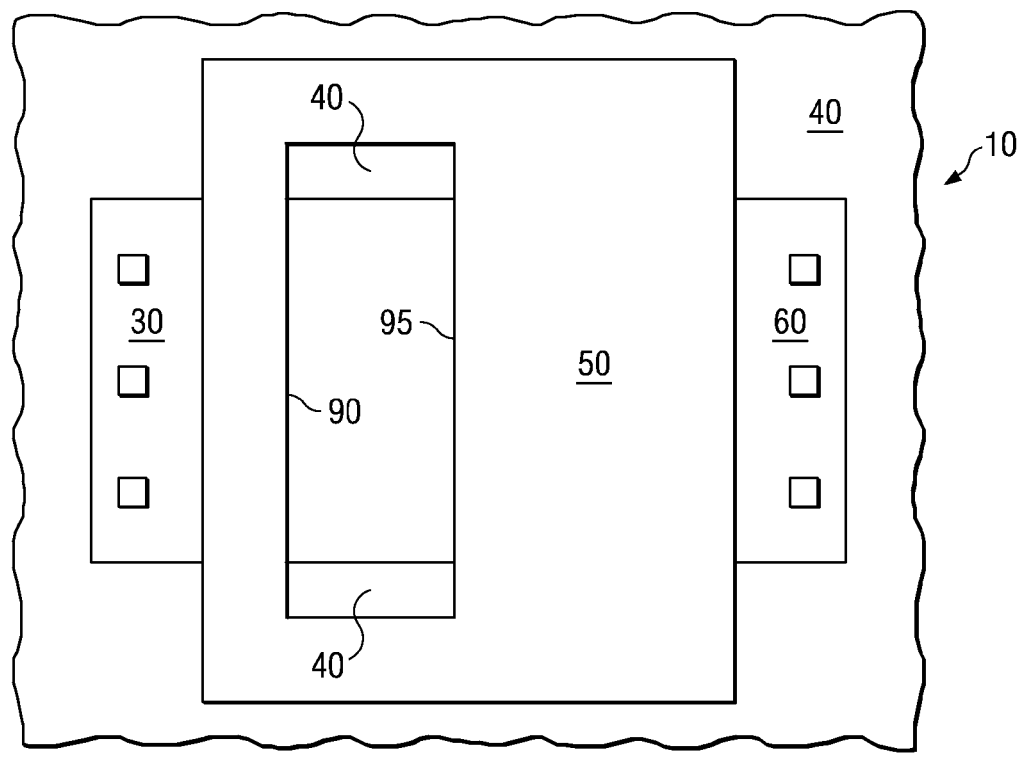
Figure 6D:
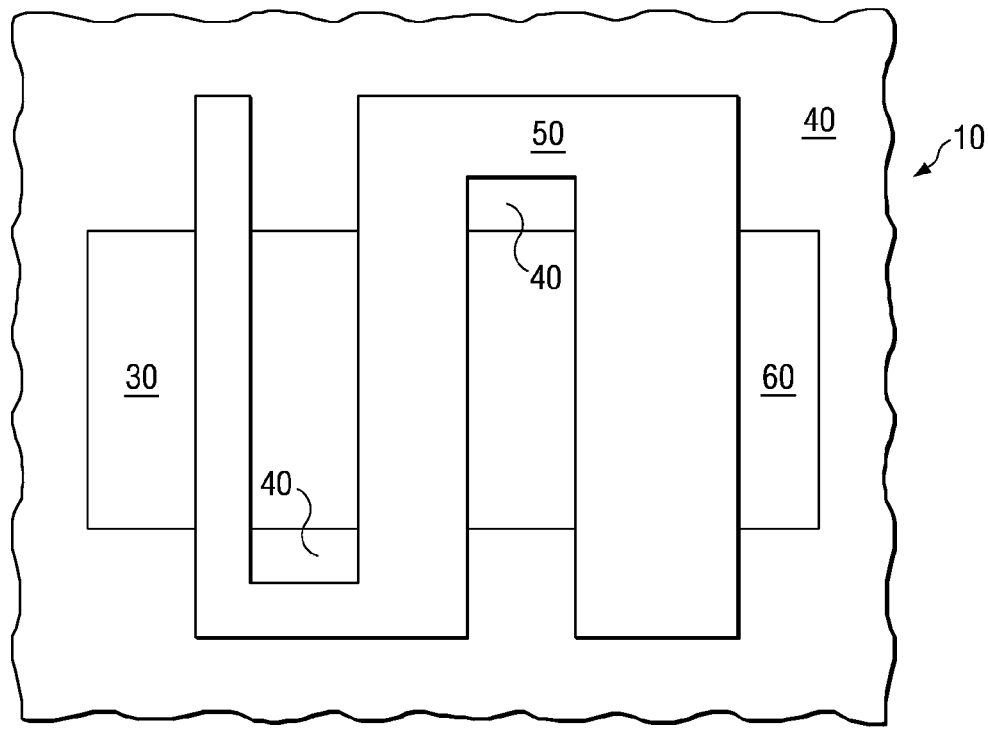
Figure 6E:
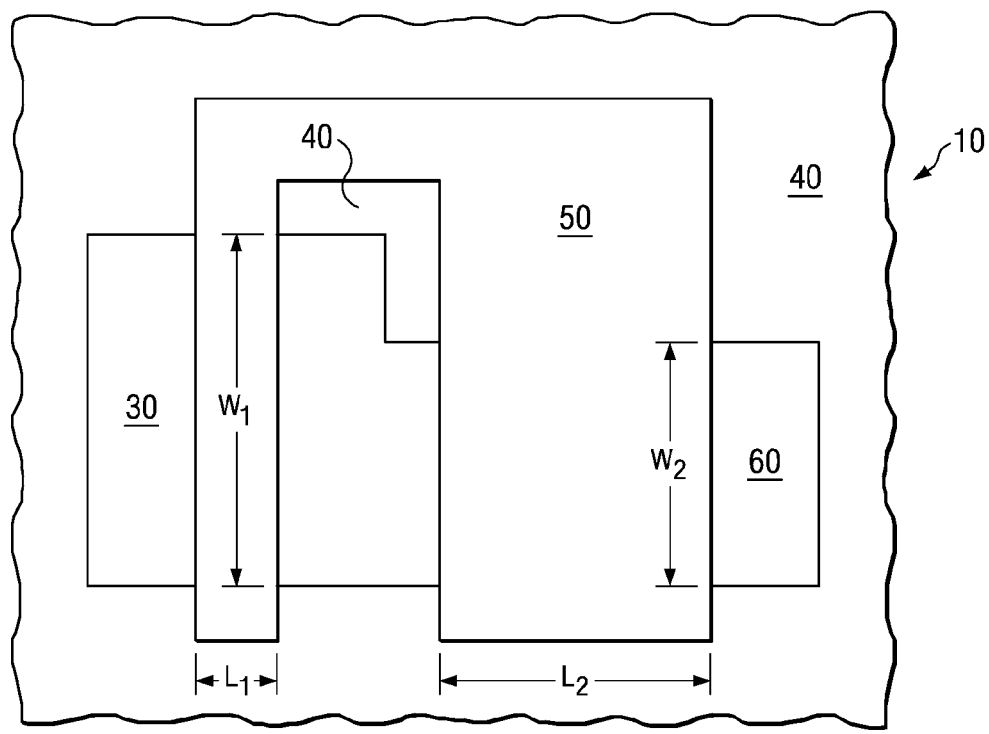
Figure 6F:
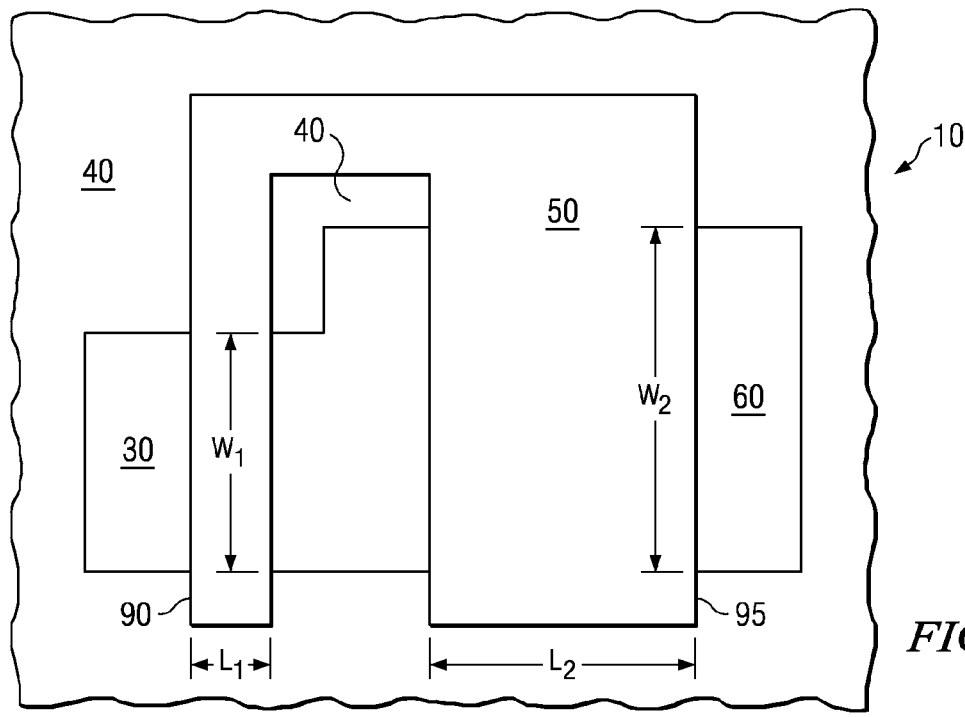

FIG. 6, which includes FIGS. 6a-6e, illustrates various structural embodiments of the invention. In FIGS. 6a and 6d, the gate line 50 includes three gates. Hence, the device 10 includes a first gate 90, a second gate 95 and a third gate 105. Each gate length is individually optimized. In FIG. 6b, the gate line 50 shares two active areas 110 and 120 forming two transistors with their own source 30 and drain 60 regions. FIG. 6c illustrates an embodiment, wherein the first gate 90 and second gate 95 are connected from both ends. FIG. 6e illustrates an embodiment in which the both the gate lengths and widths of the gate lines are individually optimized. Although in this embodiment, the section with the larger gate length has a smaller width, other embodiments may use a different combination. For example, the section with the larger gate length may have a larger width as illustrated in FIG. 6f. The larger width may be preferable in some embodiments, as the higher total current flowing through the larger width transistor results in a decrease in output conductance $g_{ds}$ of the shorter width transistor. Consequently improving the intrinsic voltage gain $g_m/g_{ds}$ of the combined devices.

Figure 7:
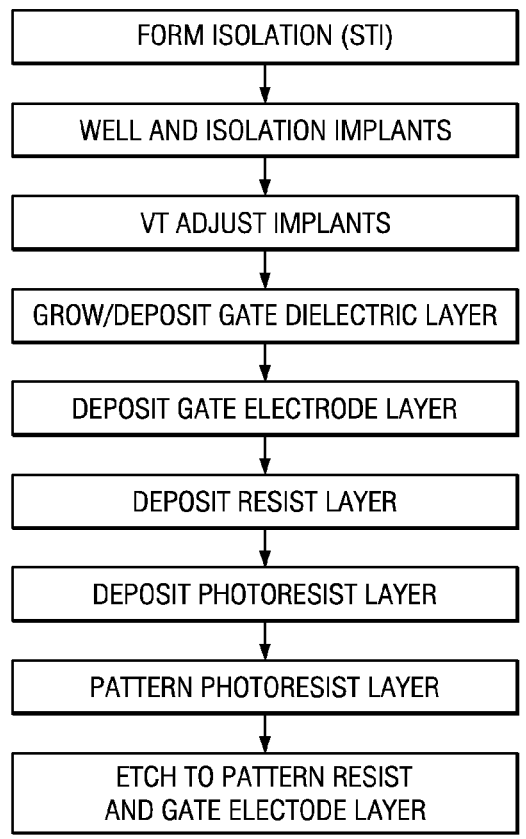
FIG. 7 is a flow chart of a method of forming the analog devices according to an embodiment of the invention.

A method of fabrication is illustrated in flow chart of FIG. 7 along with cross sectional views in FIG. 8, in accordance with an embodiment of the invention.

The analog device flow essentially comprises changing a digital technology flow to accommodate the analog device features. Hence, only some processes pertaining to the analog device will be illustrated in FIGS. 7 and 8.

Figure 8A:
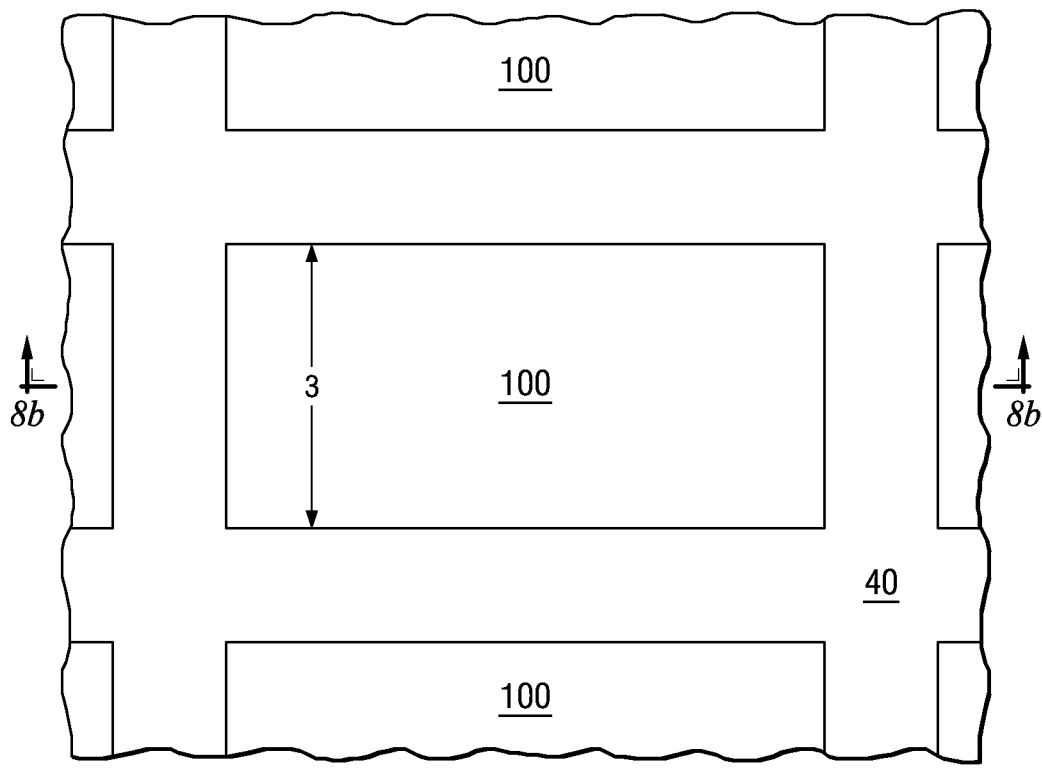
FIGS. 8a-8e, illustrates cross sections of the device during various stages of the manufacturing illustrated in flow chart 7.
Figure 8B:
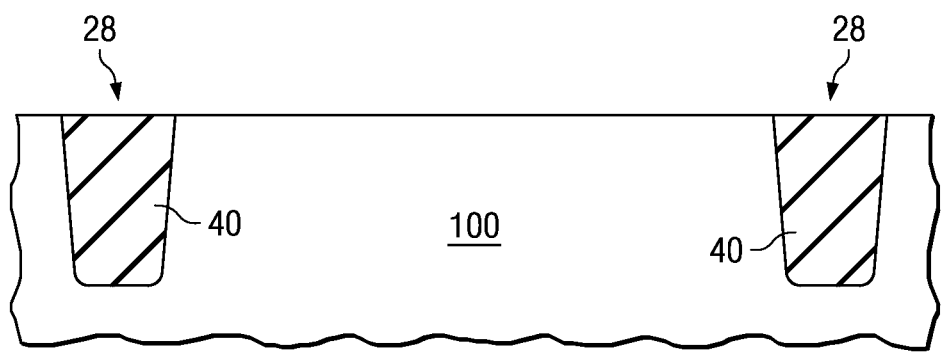

FIG. 8a is a top cross sectional view and FIG. 8b is a vertical cross section. Referring first to FIGS. 8a and 8b and the flow chart of FIG. 7, a semiconductor substrate 100 is provided. In the preferred embodiment, the semiconductor substrate 100 is a silicon wafer. Some examples of the semiconductor substrate 100 are a bulk mono-crystalline silicon substrate (or a layer grown thereon or otherwise formed therein), a layer of a silicon-on-insulator (SOI) wafer.

Isolation trenches 28 are formed in the semiconductor substrate 100 using conventional techniques. The isolation trenches 28 are then filled with an isolating material forming isolation 40. The isolation process defines the widths W of the transistors (to be formed).

The well implants, isolation implants, and threshold adjust implants are next implanted. The analog regions are masked separately and implanted separate from the logic regions. Some of the implants may be tailored to minimize noise from other active regions. For example, noise from other active devices may be transferred through the substrate. These signals could be generated anywhere in the chip, for example in regions where the drains and collectors are capacitively coupled to the substrate. These noises could be shielded by adding sufficient isolation regions. In various embodiments, the isolation implants could be modified for the analog device to shield the device from such external noise.

Figure 8C:
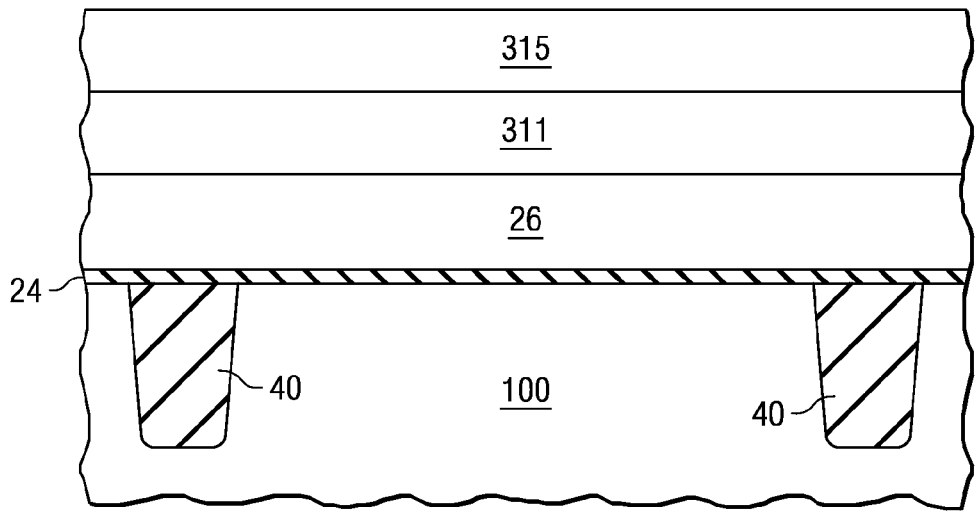

Referring next to FIG. 8c, a gate dielectric 24 is deposited over exposed portions of the semiconductor substrate 100. Advanced deeply scaled CMOS nodes have considerable gate leakage due to the use of ultra-thin gate dielectrics. For example, gate leakage can be of the order of 1-10 nA/μm for thin gate oxides. Analog circuits cannot tolerate such high gate leakages. For low-noise analog circuits, the gate leakage current level should be controlled. CMOS devices near the scaling limit are not suitable for low noise analog circuits. Also, analog circuit designers prefer to design with power-supply voltages much larger than that of high-speed digital CMOS. However, most CMOS nodes include multiple gate oxide technologies especially for designing high voltage transistors such as Input/Output (I/O) devices. A thick gate oxide is chosen from available oxides to minimize gate tunneling leakage. Of course, the thick-oxide devices are slower than the thin-oxide ones. In one embodiment, the gate dielectric 24 comprises an oxide (e.g., $SiO_2$), a nitride (e.g., $Si_3N_4$), or a combination of oxide and nitride (e.g., SiON, or an oxide-nitride-oxide sequence).

The gate electrode layer 26 is deposited over the gate dielectric 24. The gate electrode 26 preferably comprises a semiconductor material, such as polysilicon or amorphous silicon, although alternatively, other semiconductor materials or metal may be used. The gate electrode layer 26 having a thickness of between about 400 Å to 2000 Å may be deposited using CVD, PVD, ALD, or other deposition techniques.

A resist layer 311 is deposited over the gate electrode layer 26. The resist layer 311 may be either organic or inorganic. Some examples of inorganic resist layer 311 include silicon dioxide, silicon nitride, silicon oxy-nitride, titanium nitride and/or a SILK (silicon-containing low-k) layer. The resist layer 311 may also be an organic layer such as a bottom anti-reflective coating (BARC) layer (such as polymides, and polysulfones), a FLARE layer, and/or a BCB layer. The resist layer 311 may optionally be baked to form a hard baked, thermally or chemically cross-linked resist. Finally, although only a single layer of resist 311 is shown, the resist layer 311 may comprise multiple layers. For example, in some embodiments, the resist layer 311 may be a bilayer or trilayer film comprising different materials.

A photo-resist 315 is deposited on the gate stack. The photo-resist layer 315 is a resist that can be developed by exposure to radiation such as deep UV radiation used by lithography systems. In preferred embodiments, this photo-resist 315 is sensitive to 243 nm, 193 nm or 157 nm electro-magnetic radiation. The resist used may either be positive or negative. Examples of resist polymers are poly-p-hydroxy-styrene, acrylates, novolak or cycloaliphatic copolymers.

Figure 8D:
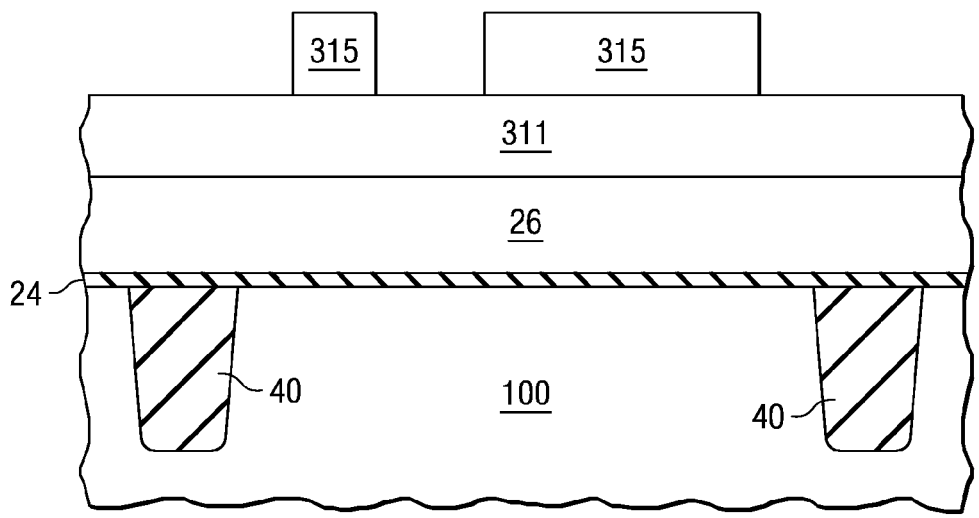
Figure 8E:
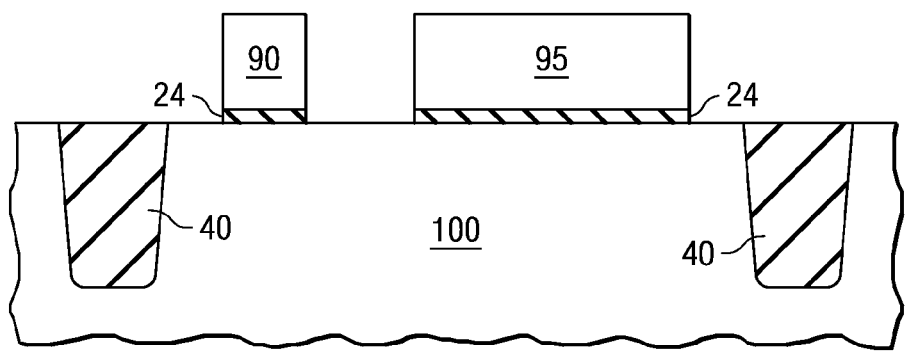

Referring to FIG. 8d, the photo-resist 315 is exposed using a mask level comprising the desired gate features (first and second gates 90 and 95). The exposed photo-resist regions are removed by etching. Using the remaining photo-resist regions as patterns, an anisotropic etch such as a reactive ion etch is used to remove the exposed portion of the resist 311. The vertical cross section at this stage of the fabrication process is illustrated in FIG. 8e. Subsequent processing proceeds as in a conventional CMOS flow, forming drain extensions, source/drains using anneals such a spike and/or laser anneals.

Embodiments of the invention will now be described to illustrate applications of the invention in manufacturing an integrated mixed signal system on chip (SoC) integrated circuits. SoC comprise both analog and digital components. As detailed in various embodiments above both the digital and analog components are manufactured using a common process. Embodiments illustrated in FIGS. 9 and 10 describe the final SoC manufactured using such a common process.

Referring to FIG. 9a, the SoC device 11 comprises digital and analog devices. The digital devices include CMOS devices. For example, in FIG. 9a, the digital devices include a nMOS 207 and a pMOS 208. The SoC device 11 also includes the analog device 10. The nMOS 20, the pMOS 208 and the analog device 10 are formed in a substrate 100 and comprise source 30, drain 60, separated by gate line 50 and spacers 51. The nMOS 207 comprises a p-channel 92 and the pMOS 208 comprises an n-channel 93. The analog device 10 includes a first transistor 900 and a second transistor 950. First channel 91 and second channel 96 are formed in the first transistor 900 and a second transistor 950 respectively. The source of the first transistor 900 is connected to the source 30; and the drain of the second transistor 950 is connected to the drain 60. The drain of the first transistor 900 and the source of the second transistor 950 are connected via the shared source/drain 31. The potential difference applied between the source contact 80 and drain contact 70 determines the direction of the current flow (shown by the arrows).

In various embodiments of the invention, the threshold voltage of the first transistor 900 is higher compared to a threshold voltage of the second transistor 950. When the drain 60 of the device 10 is biased using the contact 70, the lower threshold voltage of the second transistor 950 results in an increased potential on the shared source/drain 31. Consequently, the first transistor 900 sees a higher drain voltage resulting in a decrease in output conductance $g_{ds}$ of the first transistor 900 reducing the overall output conductance $g_{ds}$ of the combined first and second transistors 900 and 950. The reduced overall output conductance $g_{ds}$ of the combined first and second transistors 900 and 950 translates into a higher analog gain.

In various embodiments, the nMOS 20, the pMOS 208 and the analog device 10 are manufactured preferably using the same process, for example, as described in FIGS. 7 and 8. In different embodiments, the difference in threshold voltages between first and second transistors 900 and 950 is obtained by a difference in gate lengths between the transistors. In various embodiments, this difference may also be obtained by using the high voltage or low voltage oxide, or alternatively the low Vt or high Vt drain extension (e.g., halo) implants. Note that neither of these processes require additional masking steps. E.g. process flow for logic manufacturing already includes multiple gate oxides, for example, for I/O devices and core devices. The high voltage oxide for forming I/O devices can be used for the first transistor 900 and the low voltage oxide for forming the core devices can be used for the second transistor 950. Similarly, different Vt masks are already in use in logic processing. A higher halo dose (e.g., used in the high Vt cmos device) can be used in forming the first transistor 900 and low halo dose (e.g. used in low Vt or nominal Vt cmos device) can be used in forming the second transistor 950.

The threshold voltage of the first transistor 900 is preferably about 200 mV higher than the threshold voltage of the second transistor 950. In various embodiments, the threshold voltage of the first transistor 900 is at least about 100 mV higher than the threshold voltage of the second transistor 950. Although in other embodiments, the threshold voltage of the first transistor 900 may be about 100 mV to about 300 mV higher than the threshold voltage of the second transistor 950.

Figure 9B:
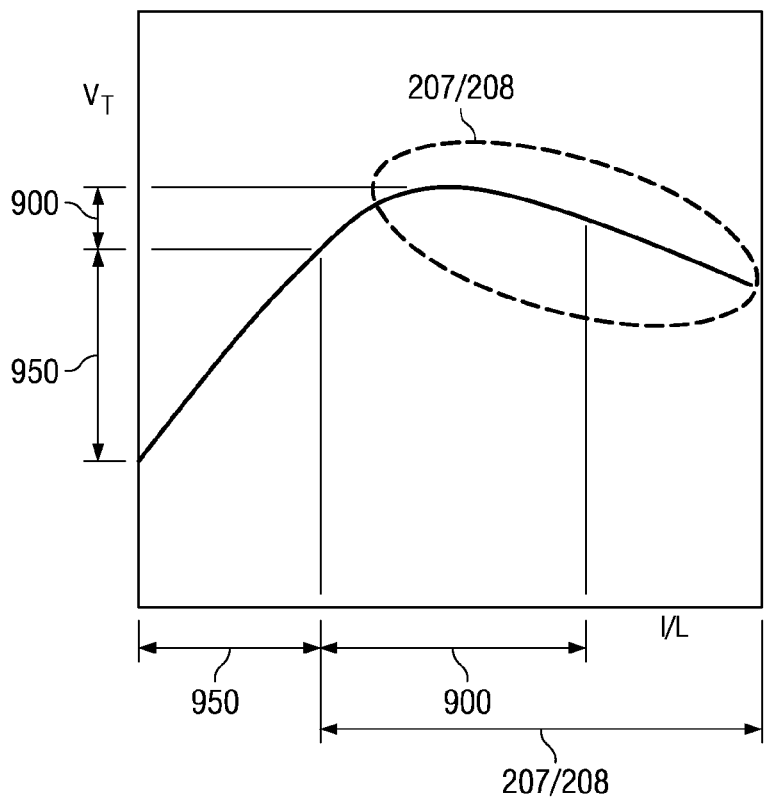

FIG. 9b illustrates threshold voltage of a transistor ($V_T$) versus inverse gate length (1/L) of devices manufactured simultaneously using a given CMOS process. For example, the digital devices (nMOS 207 and pMOS 208) in FIG. 9a may be formed using the shorter channel devices, and typically are formed around the minimum gate length device. As illustrated in FIG. 9b, the first transistor 900 with a higher threshold voltage may be selected from short channel devices, whereas the second transistor 950 with the lower threshold voltage may be selected from long channel devices. The first transistor 900 is preferably positioned around the peak of the threshold voltage versus 1/L curve. FIG. 9b illustrates the absolute threshold voltage. Hence, if both devices are pFET's, the first transistor 900 is more negative than the second transistor 950.

Figure 10B:
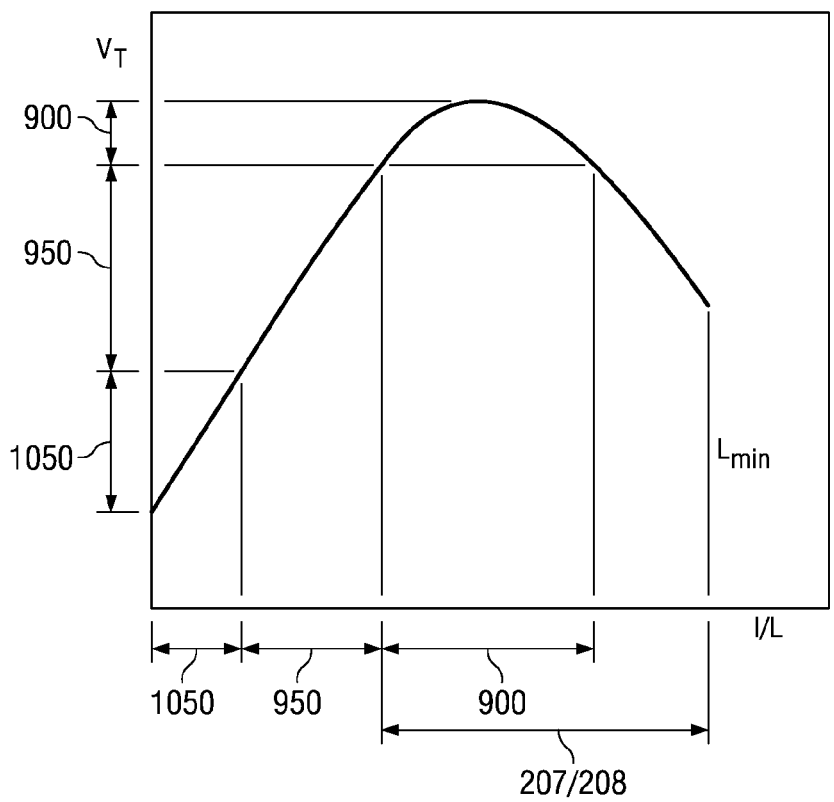
FIG. 10b illustrates the threshold voltages used in the analog and logic devices in accordance with embodiments of the invention.

FIG. 10, which includes FIGS. 10a and 10b illustrates a SoC implementing multiple gate analog devices. Unlike FIG. 9a, in FIG. 10a the analog device 10 comprises three transistors: a first transistor 900, a second transistor 950, and a third transistor 1050. As in the previous embodiments, the threshold voltage of the first transistor 900 is greater than the threshold voltage of the second transistor 950. Also, the threshold voltage of the second transistor 950 is greater than the threshold voltage of the third transistor 1050. One way of implementing the transistors with different threshold voltages is by using transistors of different gate lengths. In this case, care should be taken that the first transistor 900 is not made so short that its threshold voltage becomes lower than the second transistor 950 due to short channel effects. For example, as illustrated in FIG. 10b, the range of the first transistor 900 may be minimized or centered around the peak of the threshold voltage rolloff. In various embodiments, the first transistor 900 may be larger than the minimum allowed gate length ($L_{min}$) or the gate length at which most of the digital devices are manufactured. Although not discussed, in various embodiments, the analog device 10 may comprise more than three transistors.

Figure 11A:
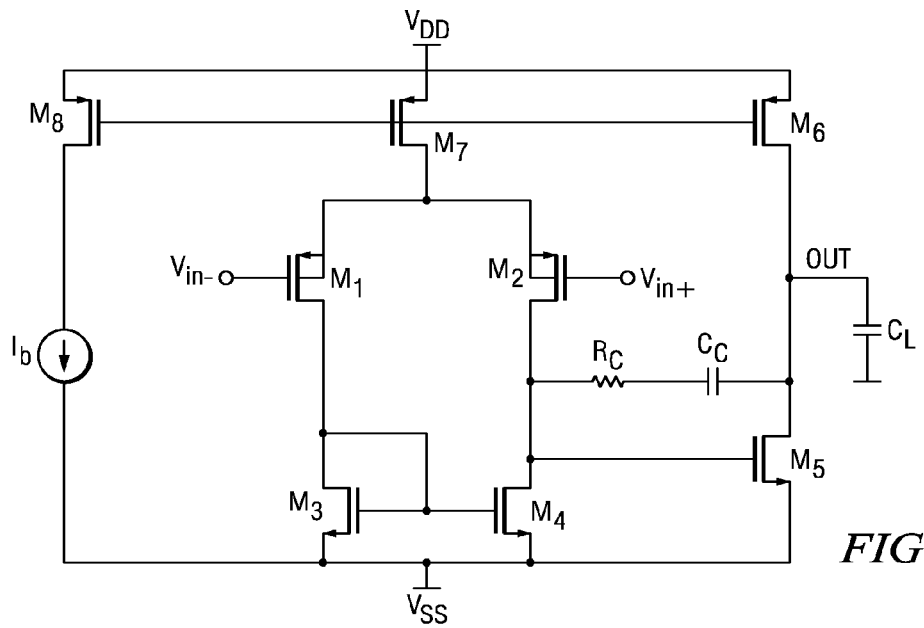
FIGS. 11a-11c, illustrates two-stage CMOS amplifier circuits incorporating embodiments of the invention.
Figure 11B:
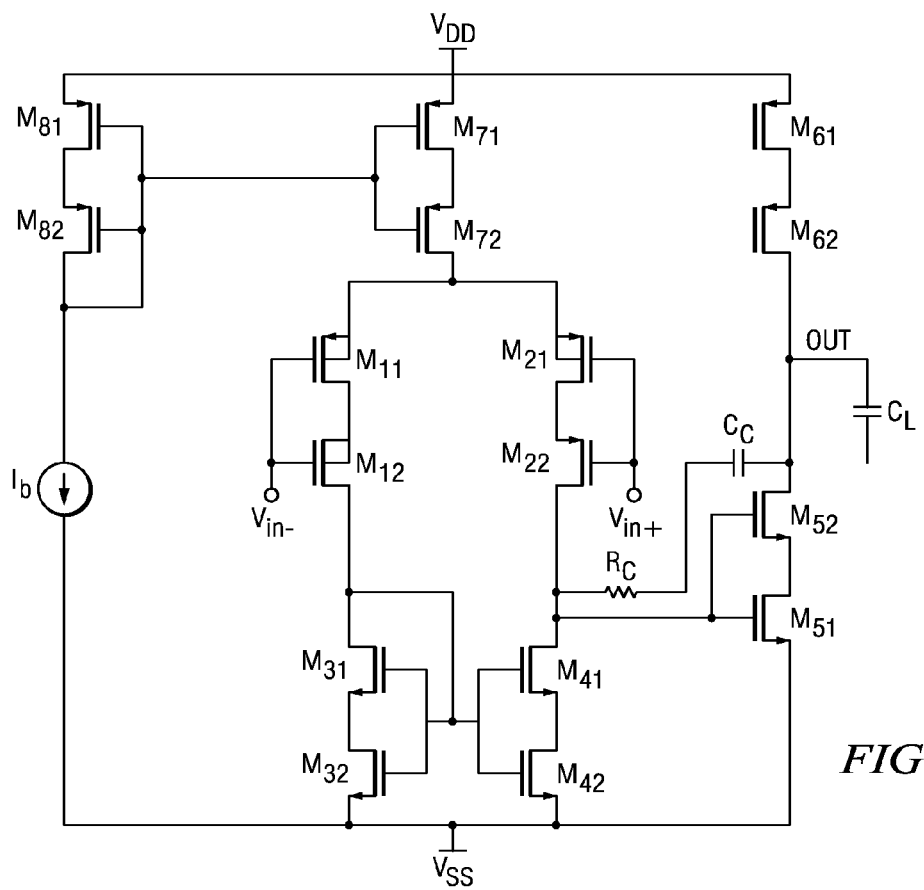
Figure 11C:
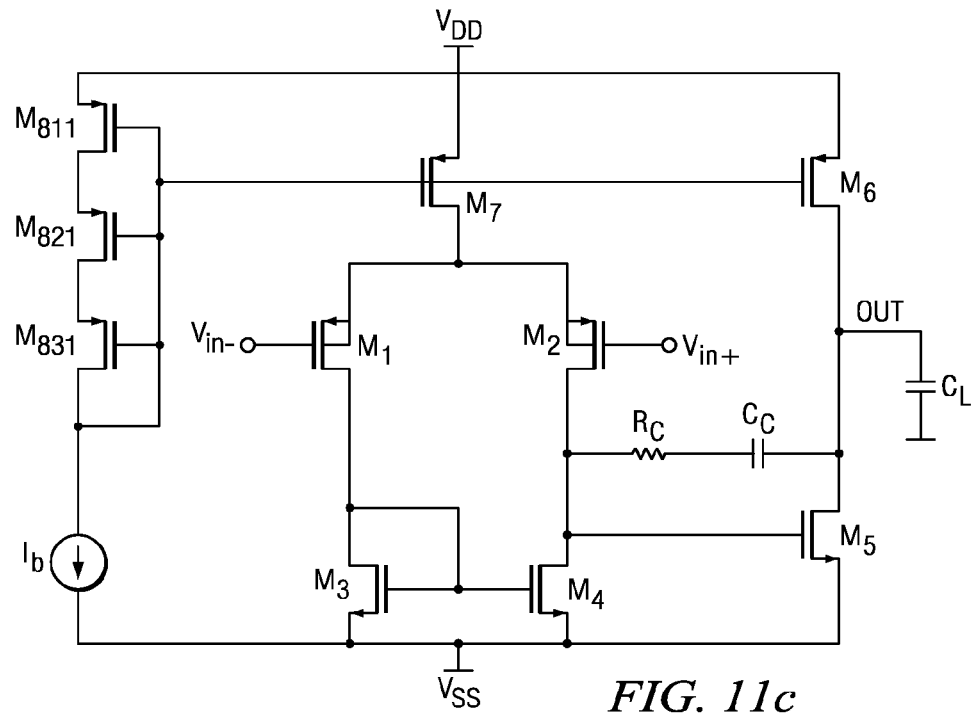
Figure 12A:
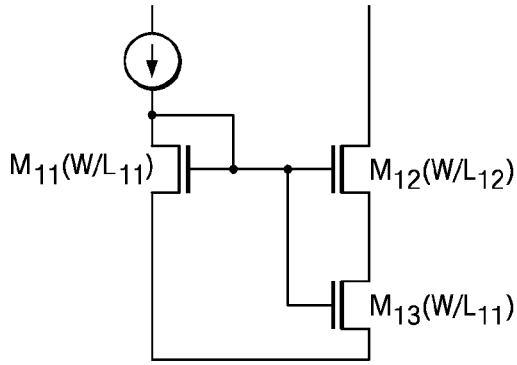
FIG. 12a and FIG. 12b, illustrates current mirrors, in accordance with embodiments of the invention.
Figure 12B:
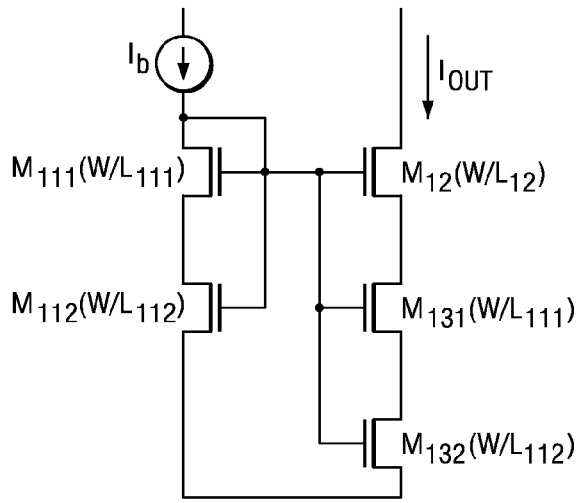

Embodiments of the invention will now be described to illustrate applications of the invention to analog circuits in FIGS. 11 and 12. FIG. 11, which includes FIGS. 11a-11c, illustrates op-amp circuits incorporating embodiments of the invention. FIG. 12, which includes FIG. 12a and FIG. 12b, illustrates current minors, in accordance with embodiments of the invention. Although, only a few analog circuits are described here, embodiments of the invention apply to all analog circuits.

FIG. 11a illustrates an effective circuit, and FIGS. 11b-11c illustrate the complete circuit for a two-stage CMOS op-amp, in accordance with an embodiment of the invention. The circuit consists of an input differential stage with active load followed by a common-source stage, also with active load. The amplifier is required to drive a fixed on-chop capacitive load of a few picofarads. This amplifier is a typical op-amp used in a large number of semiconductor components. For example, it is used applications in switched capacitor filters, sensing circuits, analog to digital converters etc.

In one embodiment, the op-amp is designed by optimizing the effective circuit of FIG. 11a. For example, the widths ($W_1$-$W_8$) and lengths ($L_1$-$L_8$) of the individual transistors ($M_1$-$M_8$), as well as the compensation capacitor $C_c$ and resistance $R_c$, and bias current $I_b$ may be optimized. The design parameters also include the voltages $V_{SS}$ and $V_{DD}$. During analog device design the widths ($W_1$-$W_8$) and lengths ($L_1$-$L_8$) are determined. However, the optimized individual transistors ($M_1$-$M_8$) may require very high analog gains unachievable using a shared CMOS process. Alternately, in some embodiments, the optimized large gate lengths may be larger than the maximum allowed gate length in a CMOS technology.

FIG. 11b illustrates an embodiment of the invention wherein each of the transistors in FIG. 11a is replaced by two or more transistors of smaller gate lengths. Hence, the transistors $M_1$-$M_8$ comprises transistors ($M_{11}$, $M_{12}$)-($M_{81}$, $M_{82}$) with corresponding gate lengths ($L_{11}$, $L_{12}$)-($L_{81}$, $L_{82}$). The gate lengths ($L_{11}$, $L_{12}$)-($L_{81}$, $L_{82}$) are smaller than the corresponding gate lengths of the single gate transistors illustrated in FIG. 11a. The sets of transistors, for example, ($M_{11}$, $M_{12}$) representing $M_1$, together match an expected analog voltage gain, a goal previously unobtainable without altering the manufacturing process.

Although, in FIG. 11b, all of the transistors in FIG. 11a are replaced with two smaller transistors, other embodiments may replace only some of the transistors. For example, after analog design, only some of the transistors may require high analog voltage gain. For example, a voltage gain of about 50 or higher may be required by only some devices. In such embodiments, only those transistors are replaced with two or more transistors. For example, in FIG. 11c, only the transistor $M_8$ of FIG. 11a is replaced with transistors $M_{811}$, $M_{821}$ and $M_{831}$.

FIG. 12a illustrates an effective current mirror, and FIG. 12b illustrates the complete current mirror, in accordance with embodiments of the invention. The effective current minor illustrated in FIG. 10a includes effective transistors $M_{11}$, and $M_{13}$, and transistor $M_{12}$. The transistor $M_{12}$ has a shorter gate length $L_{12}$ than the gate length $L_{11}$ of the other two effective transistors ($M_{11}$ and $M_{13}$).

FIG. 12b illustrates the complete current mirror of FIG. 12a. As the analog voltage gain of the transistor $M_{11}$ with gate length $L_{11}$ is high, the transistor $M_{11}$ is replaced with other two transistors ($M_{in}$ and $M_{112}$) with an effective larger voltage gain. Similarly, if the required voltage gain of the transistor $M_{13}$ with gate length $L_{11}$ is high, the transistor $M_{13}$ is replaced with other two transistors ($M_{131}$ and $M_{132}$). In various embodiments, the effective transistors $M_{11}$ and $M_{13}$ are divided into transistors with gate lengths $L_{111}$ and $L_{112}$, wherein the transistor $M_{132}$ has a lower threshold voltage than the transistor $M_{131}$. In some embodiments, the gate length $L_{112}$ of the transistor $M_{132}$ is larger than the gate length $L_{111}$ of the transistor $M_{111}$. The gates of the transistors $M_{111}$ and $M_{112}$ are tied together forming the effective transistor M. Similarly, the gates of the transistors $M_{131}$ and $M_{132}$ are tied together forming the effective transistor $M_{13}$. The source/drain of the transistors $M_{112}$ and $M_{132}$ are tied together forming the current mirror circuit.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit comprising an asymmetric segmented transistor, the asymmetric segmented transistor comprising:
   an active region disposed at a surface of a semiconductor body;
   a source region and a drain region disposed within the active region;
   a floating source/drain region disposed within the active region;
   a first channel region having a first doping type disposed in the active region between the source region and the floating source/drain region, the first channel having a first length and a first width;
   a second channel region having the first doping type disposed in the active region between the drain region and the floating source/drain region, the second channel region having a second length and a second width different from the first width;
   a first gate dielectric overlying the first channel region;
   a second gate dielectric overlying the second channel region;
   a first gate line overlying the first gate dielectric; and
   a second gate line overlying the second gate dielectric, wherein the first gate line and second gate line are directly electrically coupled.

2. The integrated circuit of claim 1, wherein the integrated circuit comprises analog circuitry comprising the asymmetric segmented transistor and digital circuitry comprising digital devices, and wherein the first gate dielectric, the second gate dielectric, the source, the drain, and the floating source/drain regions of the asymmetric segmented transistor are substantially identical to at least one of the digital devices.

3. The integrated circuit of claim 1, wherein the first gate dielectric is thicker than the second gate dielectric.

4. The integrated circuit of claim 3, wherein the first gate dielectric is a high voltage gate oxide of a digital device and the second gate dielectric is a low voltage gate oxide of a digital device.

5. The integrated circuit of claim 3, wherein the first channel region comprises a higher doping than the second channel region, and wherein the first channel region comprises a doping of a high voltage digital device, and the second channel region comprises a doping of a nominal voltage digital device.

6. The integrated circuit of claim 1, further comprising:
   an alternate floating source/drain region disposed within the active region;
   a third channel region disposed in the active region between the alternate floating source/drain region and the drain region, the third channel having a third length and a third width, wherein the second channel region is disposed between the alternate floating source/drain region and the floating source/drain region; and
   a third gate dielectric overlying the third channel, the gate line overlying the third gate dielectric.

7. The integrated circuit of claim 1, wherein the second length is greater than the first length.

8. The integrated circuit of claim 1, wherein the first gate line and the second gate line comprise a single gate line.

9. The integrated circuit of claim 1, wherein the asymmetric segmented transistor is part of a current mirror circuit.

10. The integrated circuit of claim 1, wherein the asymmetric segmented transistor is part of a CMOS amplifier circuit.

11. The integrated circuit of claim 1, wherein the asymmetric segmented transistor is part of an operational amplifier circuit.

12. A semiconductor device comprising:
    a first transistor having a first source region, a first drain region and a first gate region, the first source region of the first transistor being coupled to the first gate region of the first transistor;
    a second transistor having a second source region, a second drain region and a second gate region, the second gate region of the second transistor being coupled to the first gate region of the first transistor; and
    a third transistor having a third source region, a third drain region and a third gate region, the third gate region of the third transistor being coupled to the first gate region of the first transistor and the third source region of the third transistor being coupled to the second drain region of the second transistor,
    wherein the first transistor and the third transistor each comprises an asymmetrical segmented transistor with high analog voltage gain, wherein the asymmetrical segmented transistor comprises a floating source/drain region.

13. The semiconductor device of claim 12, wherein the floating source/drain region of the first transistor is disposed between the first source region and the first drain region such that the first gate region overlies both a first channel region between the first source region and the floating source/drain region and a second channel region disposed between the floating source/drain region and the first drain region, and wherein the floating source/drain region of the third transistor is disposed between the third source region and the third drain region such that the third gate region overlies both a third channel region between the third source region and the floating source/drain region and a fourth channel region disposed between the floating source/drain region and the third drain region.

14. The semiconductor device of claim 13, wherein the analog voltage gain of the first and third transistor is at least greater than 50.

15. A semiconductor device comprising an asymmetric segmented transistor, the semiconductor device comprising:

active region disposed at a surface of a semiconductor body;
a source region and a drain region disposed within the active region;
a floating source/drain region disposed within the active region;
a first channel region in the active region disposed between the source region and the floating source/drain region, the first channel having a first length and a first width;
a second channel region disposed in the active region between the drain region and the floating source/drain region, the second channel having a second length and a second width;
a first gate dielectric disposed over the first channel region;
a second gate dielectric disposed over the second channel region;
a first gate line overlying the first gate dielectric;
a second gate line overlying the second gate dielectric, wherein the first gate line and second gate line are coupled;
an alternate floating source/drain region disposed within the active region;
a third channel region disposed in the active region between the alternate floating source/drain region and the drain region, the third channel having a third length and a third width, wherein the second channel region is disposed between the alternate floating source/drain region and the floating source/drain region;
a third gate dielectric overlying the third channel; and
a third gate line overlying the third gate dielectric, wherein the second length is greater than the first length, and wherein the third length is greater than the second length, wherein the alternate floating source/drain region, the third channel region and the third gate dielectric are part of the asymmetric segmented transistor.

16. The device of claim 15, wherein the asymmetric segmented transistor is part of an operational amplifier circuit.

17. The device of claim 15, wherein the asymmetric segmented transistor is part of a current mirror circuit.

18. A semiconductor device comprising an analog component and a digital component, the analog component comprising:
a gate dielectric layer comprising a first gate dielectric and a second gate dielectric disposed over a semiconductor body;
a first gate comprising a gate material layer disposed over the first gate dielectric;
a second gate comprising the gate material layer disposed over the second gate dielectric;
a first channel disposed underneath the first gate;
a second channel disposed underneath the second gate, wherein the first channel comprises a first length and a first width, and the second channel comprises a second length and a second width;
a first transistor comprising a first source and a first drain, the first source and the first drain being separated by the first channel;
a second transistor comprising a second source and a second drain, the second source and the second drain being separated by the second channel, wherein the first drain and the second source share a first common region, and wherein a threshold voltage of the first transistor is higher than a threshold voltage of the second transistor; and
wherein the first gate is electrically coupled to the second gate, wherein the analog component comprises an asymmetric segmented transistor having the first and the second transistors, wherein the digital component comprises a digital device, and wherein the gate dielectric layer, the first source and the first common region of the asymmetric segmented transistor are substantially identical to the digital device in the digital component.

19. The semiconductor device of claim 18, wherein the first length is smaller than the second length.

20. The semiconductor device of claim 18, wherein the first gate and the second gate are physically connected.

21. The semiconductor device of claim 18, wherein the first width is smaller than the second width.

22. The semiconductor device of claim 18, wherein the first gate dielectric comprises a high voltage gate dielectric of the digital component and the second gate dielectric comprises a nominal voltage gate dielectric of the digital component.

23. The semiconductor device of claim 18, wherein the analog component comprises a current mirror circuit.

24. The semiconductor device of claim 18, wherein the analog component comprises an operational amplifier circuit.

25. The integrated circuit of claim 6, wherein a threshold voltage of a first transistor formed under the first gate line is higher than a threshold voltage of a second transistor formed under the second gate line.

26. The integrated circuit of claim 25, wherein the second length is greater than the first length, and wherein the third length is greater than the second length.

27. The integrated circuit of claim 6, wherein the second length is greater than the first length, and wherein the third length is greater than the second length.

28. The semiconductor device of claim 18, further comprising:
a third transistor comprising a third source and a third drain, wherein the second drain and the third source share a second common region.

29. The semiconductor device of claim 13, wherein the semiconductor device is a current mirror.

30. A semiconductor device comprising an asymmetric segmented transistor, the semiconductor device comprising:
a first channel region disposed in a device region of a substrate, the first channel having a first length and a first width;
a second channel region disposed in the device region, the second channel having a second length and a second width;
a first floating source/drain region disposed in the device region between the first channel region and the second channel region;
a third channel region disposed in the device region, the third channel having a third length and a third width; and
a second floating source/drain region disposed within the device region between the second channel region and the third channel region, wherein the second length is greater than the first length, and wherein the third length is greater than the second length, wherein the second floating source/drain region and the third channel region are part of the asymmetric segmented transistor.

31. The device of claim 30, wherein the asymmetric segmented transistor is part of an operational amplifier circuit.

32. The device of claim 30, wherein the asymmetric segmented transistor is part of a current mirror circuit.

33. The device of claim 30, wherein the second channel region is disposed between the first floating source/drain region and the second floating source/drain region.

34. The device of claim 30, further comprising:
a source region and a drain region disposed within the device region, wherein the first channel region is disposed between the source region and the first floating source/drain region.

35. The device of claim 30, further comprising:
a first gate dielectric disposed over the first channel region;
a first gate line overlying the first gate dielectric;
a second gate dielectric disposed over the second channel region;
a second gate line overlying the second gate dielectric;
a third gate dielectric overlying the third channel; and
a third gate line overlying the third gate dielectric.

36. The device of claim 35, wherein the first gate line and second gate line are coupled.

37. The device of claim 35, wherein the first gate line, the second gate line, and the third gate line are coupled together.

* * * * *